(12) United States Patent
Kim

(10) Patent No.: US 6,576,502 B1
(45) Date of Patent: Jun. 10, 2003

(54) METHOD FOR FORMING LDD/OFFSET STRUCTURE OF THIN FILM TRANSISTOR

(75) Inventor: Hye-dong Kim, Kyungki-do (KR)

(73) Assignee: Samsung SDI Co. Ltd., Suwon (KR)

( * ) Notice: Subject to any disclaimer, the term of this patent is extended or adjusted under 35 U.S.C. 154(b) by 122 days.

(21) Appl. No.: 09/693,992

(22) Filed: Oct. 23, 2000

(30) Foreign Application Priority Data

Oct. 26, 1999 (KR) .............................................. 99-46535

(51) Int. Cl.[7] ........................ H01L 21/00; H01L 21/326
(52) U.S. Cl. ........................ 438/151; 438/151; 438/152; 438/166; 438/466
(58) Field of Search .................................. 438/151, 152, 438/166, 165, 164, 163, 160, 161, 159, 466

(56) References Cited

U.S. PATENT DOCUMENTS

| | | | |
|---|---|---|---|
| 5,292,675 A | * | 3/1994 | Codama |
| 5,728,592 A | * | 3/1998 | Oki et al. |
| 5,741,718 A | * | 4/1998 | Codama et al. |
| 5,801,077 A | | 9/1998 | Chor et al. ............. 438/305 |
| 6,255,025 B1 | * | 7/2001 | Akutsu et al. |

FOREIGN PATENT DOCUMENTS

JP  9-27620  1/1997

OTHER PUBLICATIONS

S. Wolf and Tauber, Silicon Processing for the VLSI Era, Lattice Press, vol. I—Process Technology, p. 416.*

* cited by examiner

Primary Examiner—John F. Niebling
Assistant Examiner—Stanetta Isaac
(74) Attorney, Agent, or Firm—Staas & Halsey LLP

(57) ABSTRACT

A method for fabricating a thin film transistor. An active layer is first formed on a substrate, then a first insulating layer is formed on the active layer. Next, a gate electrode pattern is formed on the first insulating layer and an LDD region is formed by lightly doping ions in the active layer using the gate electrode pattern as a mask. A polymer layer is formed on a surface of the gate electrode pattern using an electrochemical polymerizing process, and source and drain contact layers are formed by densely doping ions in the active layer using the gate electrode pattern deposited with the polymer layer. A second insulating layer is then formed on a surface of the first insulating layer while covering the gate electrode pattern. Contact holes are formed through the insulating layers, and metal material is sputtered in the contact holes to form the source and drain electrodes.

4 Claims, 4 Drawing Sheets

METHOD FOR FORMING LDD/OFFSET STRUCTURE OF THIN FILM TRANSISTOR

BACKGROUND OF THE INVENTION

1. Field of the Invention

The present invention relates to method for fabricating a thin film transistor and, more particularly, to method for forming offset/LDD structure in a thin film transistor.

2. Description of Related Art

Generally, as a thin film transistor can contain a CMOS, it has been widely used as a pixel On/Off switching element in a flat display such as an active matrix liquid crystal display. Such a thin film transistor should be designed having a voltage-resistance and a high On/Off current ratio.

The thin film transistor can be classified into two types: amorphous silicon transistors and poly silicon transistors. Although the poly silicon transistor is superior to the amorphous silicon transistor with regard to the electron moving rate and reliability, since a layer of the poly silicon transistor must be formed in a high temperature environment, the amorphous silicon transistor has been more widely used.

However, in recent years, as the layer of the poly silicon transistor can be formed in a low temperature environment using a system such as an eximer laser apparatus, greater use and development of the poly silicon transistor have taken place.

The poly silicon transistor is generally made by depositing amorphous silicon on a substrate, then by growing the amorphous silicon as the poly silicon by radiating eximer laser on the amorphous silicon. The poly silicon thin film transistor appears high current quality when it is turned on. However, since the poly silicon has a typical trap level at various portions, a large amount of current leakage is generated in a state where the transistor is turned off.

To solve the above problem, an offset region which is not doped with ions is formed between source and drain electrodes to interrupt the current leakage. Furthermore, a lightly doped drain (LDD) region is additionally formed to stabilize the offset region.

In conventional methods, the offset and LDD regions are formed through photolithography processes, which is complicated. However, a technology for forming the offset region without using a photolithography process has been developed.

That is, after densely doped source and drain contact regions are first formed, a gate electrode is anodized so that a section area thereof is eroded by an anodizing layer, thereby naturally forming the offset region within an active layer.

However, in this technology, it is limited to reduce an area of the gate electrode using the anodizing process. Furthermore, since a thickness of the gate electrode is reduced by as much as a thickness of the anodizing layer, the flow of current is deteriorated. In addition, as the anodizing layer is grown, a short circuit may occur between the source and drain electrodes.

In another method, the offset region is formed by wet-etching a sidewall of a gate electrode, which is protected by a photoresist layer. However, since the photoresist layer is hardened during a process for doping ions, it is difficult to eliminate the photoresist layer after the offset region forming process. In addition, if there is not accuracy in the alignment, it is difficult to obtain a desired offset region.

SUMMARY OF THE INVENTION

Therefore, the present invention has been made in an effort to solve the above-described problems of the conventional technologies.

It is an object of the present invention to provide a method of making a thin film transistor in which offset and LDD regions can be easily formed through an electrochemical polymerizing process.

To achieve the above and other objects, the present invention provides a method of forming a polymer layer used in forming an LDD structure of a thin film transistor, comprising: preparing a substrate on which an active layer, an insulating layer covering the active layer, and a gate electrode are formed in this order, dipping the substrate into electrolyte containing monomer; and generating an electric field by using an electric power supplier having a first end coupled to the gate electrode and a second end coupled to a metal electrode so that a polymer is formed enclosing the gate electrode at a predetermined thickness.

Preferably, the metal electrode includes a common electrode formed on the substrate and is made of a material or alloy selected from the group consisting of Cr, Ni, Ag, Au, Zn, Sn, Cu, Fe, Al, Pt, V, and C.

The monomer is selected from vinyl monomer and alkyl monomer. Preferably, the monomer is dissolved in a solvent and the solvent is selected from the group consisting of $CH_2Cl_2$, THF, $CH_3CN$, DMF, DMSO, acetone, and water.

According to another aspect, the present invention provides a method of forming an offset/LDD structure of a thin film transistor, comprising: the steps of forming an active layer on a substrate, depositing an insulating layer on the substrate while covering the active layer, patterning a gate electrode on the insulating layer, forming a polymer layer by electrochemical polymerizing process such that the polymer layer encloses the gate electrode in a predetermined thickness, densely doping ions into the active layer using the polymer layer, removing the polymer layer.

The method may further comprise light doping ions into the active layer using the gate electrode as a mask before the forming a polymer layer or after the removing the polymer layer.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DESCRIPTION OF PREFERRED EMBODIMENT

Reference will now be made in detail to the present embodiments of the invention, an example of which is illustrated in the accompanying drawings. Wherever possible, the same reference numbers will be used throughout the drawings to refer the same or like part FIGS. 1a through 1f show sequential process steps of a thin film transistor according to an embodiment of the present invention.

Figure 1A:
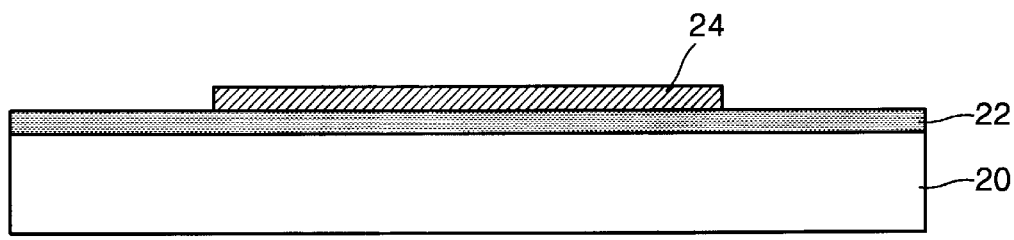
FIGS. 1a through 1f illustrate, in cross-section, a portion of a TFT as it undergoes sequential processing steps according to an embodiment of the present invention.
Figure 1B:
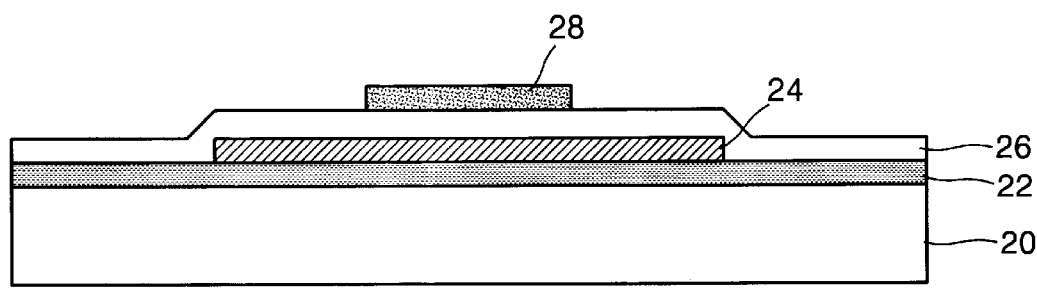

As shown in FIG. 1a, a buffer layer 22 is first formed on a TFT substrate 20, and then an active layer 24 is formed on the buffer layer 22. Subsequently, as shown in FIG. 1b, a first insulating layer 26 is formed on the buffer layer 22 while covering the active layer 24, and a gate electrode 28 is patterned on the first insulating layer 26 through a photolithography process.

Figure 1C:
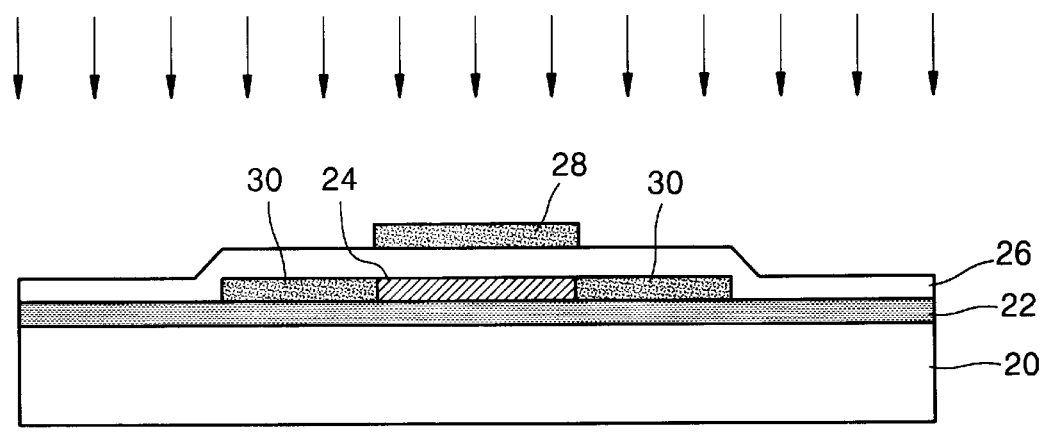

Next, as shown in FIG. 1c, ions are lightly doped in the active layer 24 using the gate electrode pattern 28 as a mask. As a result, an LDD region 30 is formed on the active layer 24, excluding a portion that is shielded by the gate electrode pattern 28.

The buffer layer 22 may be omitted in the above-described structure.

To form the active layer 24, amorphous silicon is first deposited on the buffer layer 22, and then the amorphous silicon is etched in a predetermined pattern. Next, the amorphous silicon pattern is grown as a poly silicon pattern by radiating an eximer laser on the amorphous silicon pattern, thereby obtaining the active layer 24.

Preferably, the first insulating layer 26 is made of $SiO_2$ using a tetraethyl-o-silicate method, chemical vapor-phase deposition method, or sputtering method, and has a thickness of about 100 nm.

The gate electrode pattern 28 is formed of a metal material such as Ta, Al, Nb, silicon doped with n or p-ions, or ITO. The gate electrode is preferably formed having a thickness of less than 200 nm.

Next, after a photoresist layer used to form the gate electrode pattern 28 is removed, a polymer layer 32 is deposited on the gate electrode pattern 28, and then icons are densely doped in the active layer 24.

The polymer layer 32 is formed by an electrochemical polymerizing process according to a feature of the present invention. That is, in a state where the substrate 20 on which the gate electrode pattern 28 is formed is dipped into electrolyte containing monomer dissolved in a solvent, when electric power is applied to the electrolyte through a metal electrode, the polymer layer 32 is plated on the gate electrode 28.

Figure 3:
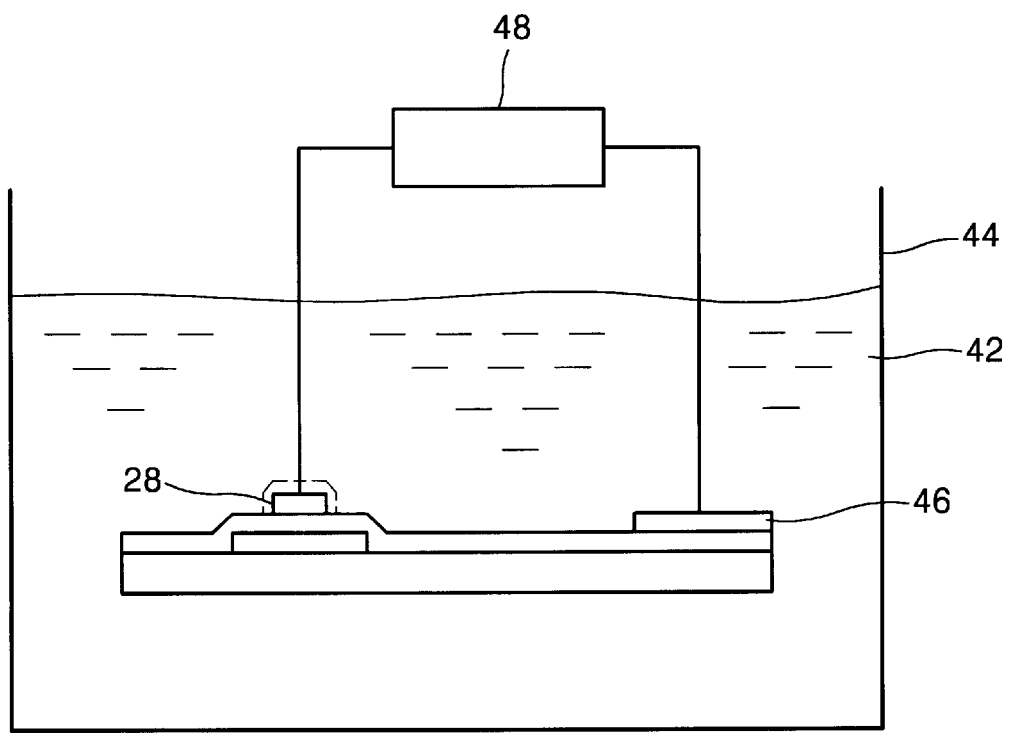
FIG. 3 is a schematic view of an apparatus to perform an electroplating process according to the present invention.

FIG. 3 shows a plating apparatus that can be employed to the present invention.

The plating apparatus comprises a bath 44 containing the electrolyte 42 having the monomer to plate polymer on the exposed gate electrode 28 and an electric power source 48 having a first end coupled to the gage electrode 28 and a second end coupled the metal electrode 46.

The thickness of the plated polymer can be adjusted by varying an amount of current and a process time. The materials of the electrode, the electrolyte, the monomer, and the solvent also affect the thickness of the plated polymer.

The metal electrode is made of a material or alloy selected from the group consisting of Cr, Ni, Ag, Au, Zn, Sn, Cu, Fe, Al, Pt, V and C. Alternatively, an electrode for a storage capacitor of a thin-film transistor can be also used as the metal electrode. At this point, as the electrode for the storage capacitor, a common electrode formed on a substrate is used. Preferably, the common electrode is formed of a material identical to that of the gate electrode.

Preferably, the metal electrode may be mounted on the bath 44. At this point, it is preferable that the metal electrode is disposed on a same plane as the gate electrode so that electric field can be formed on a side of the gate electrode, thereby easily plating polymer on the side of the gate electrode.

In this embodiment, as shown in FIG. 3, the common electrode for the storage capacitor formed on the substrate is exampled. That is, the polymer plating process is performed in a state where the first end (i.e., anode) of the electric power source 48 is coupled to the gate electrode 28 and the second end (i.e., cathode) to the common electrode 46.

In addition, the solvent is selected from the group consisting of $CH_2Cl_2$, tetrahydrofuran(THF), $CH_3CN$, N,N-dimethylform aldehyde (DMF), dimethylsulfoxide (DMSO), acetone, and water.

The electrolyte is selected from the group consisting of $Bu_4NPF_6$, $Bu_4NClO_4$, HCl, $H_2SO_4$, $HNO_3$, and $HClO_4$.

The monomer used for the polymerizing process is selected from vinyl monomer and alkyl monomer. Preferably, the vinyl monomer is selected from the group consisting of methyl methacrylate, acrylamide, acrylic acid, acrylonitrile, and styrene. Allylbenzene may be used for alkyl monomer.

Alternatively, the polymer layer may be plated through a ring opening polymerizing process using caprolactam or styrenesulfide.

Figure 1D:
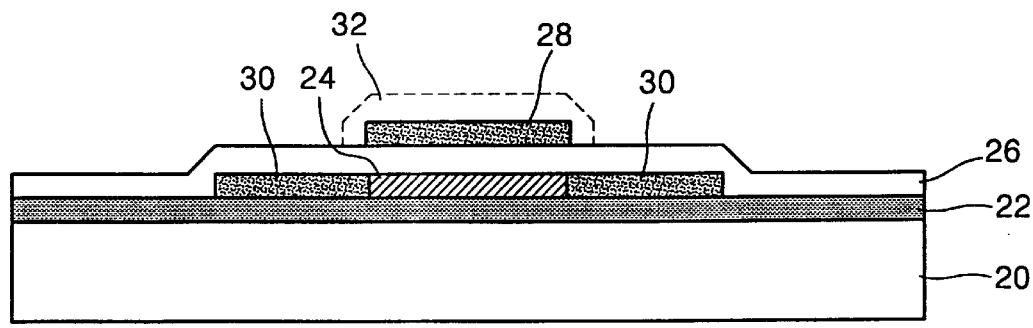

Using the above described plating apparatus, as shown in FIG. 1d, a polymer layer 32 is plated covering the gate electrode 28.

Figure 1E:
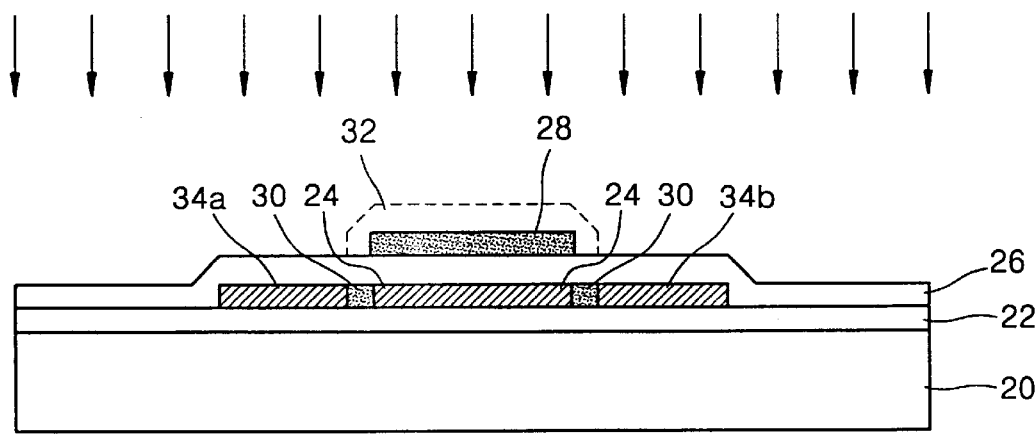

After the above, when ions are densely doped using the gate electrode pattern 28 coated with the polymer layer 32 as a mask, as shown in FIG. 1e, opposite ends of the active layer 24 become contact layers 34a and 34b for defining source and drain electrodes. Next, the polymer layer 32 is removed.

Figure 1F:
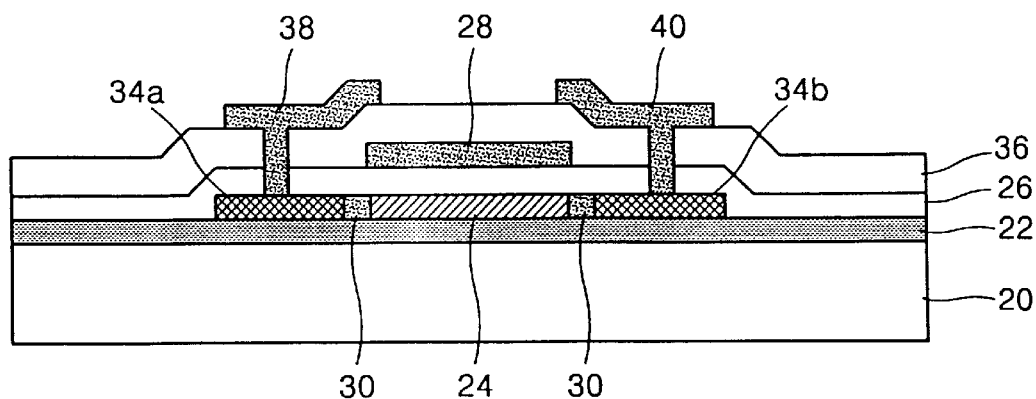

Then, after removing the polymer layer 32, a process of manufacturing the TFT is performed. That is, as shown in FIG. 1f, a second insulating layer 36 is deposited on a surface of the first insulating layer 26 while covering the gate electrode pattern 28, then contact holes are formed to connect to contact layers 34a and 34b. Metal is filled in the contact holes to form the source and drain electrodes 38 and 40.

FIGS. 2a through 2d illustrate, in cross-section, a portion of a TFT as it undergoes sequential processing operations according to another embodiment of the present invention.

Figure 2A:
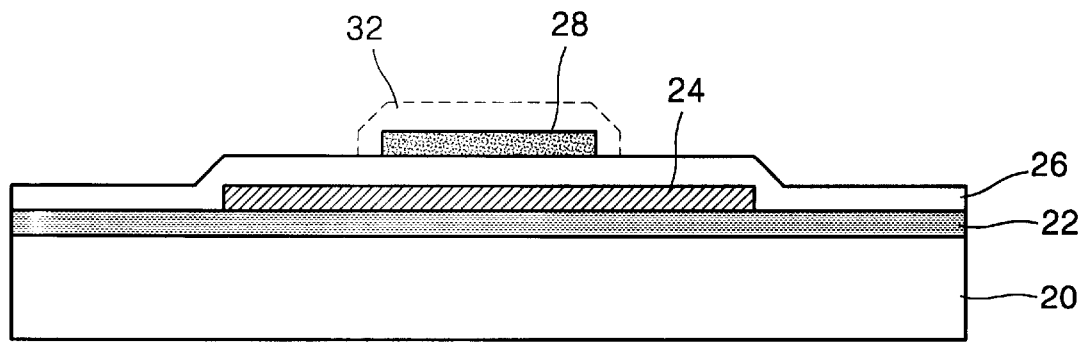
FIGS. 2a through 2d illustrate, in cross-section, a portion of a TFT as it undergoes sequential processing operations according to another embodiment of the present invention.
Figure 2B:
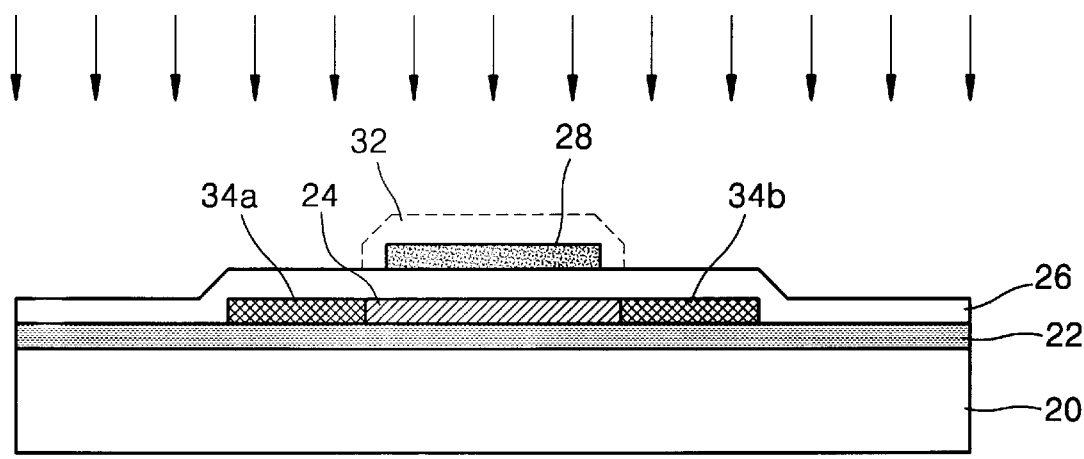

After forming the first gate electrode 28 as in the previous embodiment, as shown in FIG. 2a, a polymer layer 32 is plated covering the gate electrode 28 using the same manner as in the previous embodiment, after which icons are densely doped using the polymer layer 32 as a mask as shown in FIG. 2b.

Figure 2C:
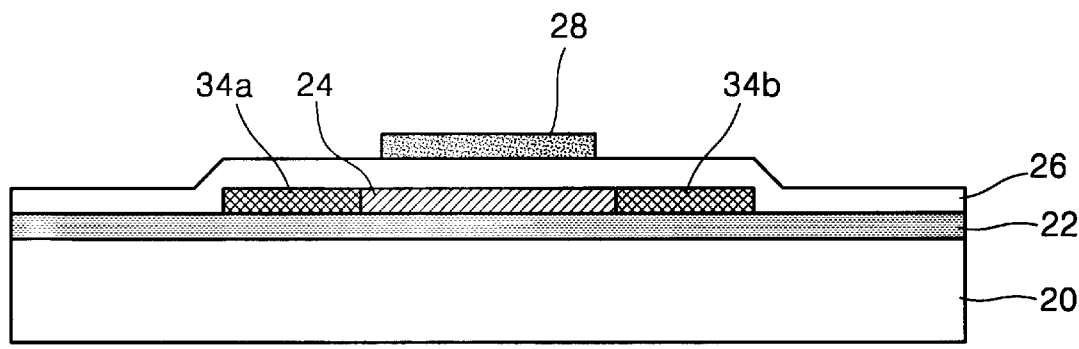
Figure 2D:
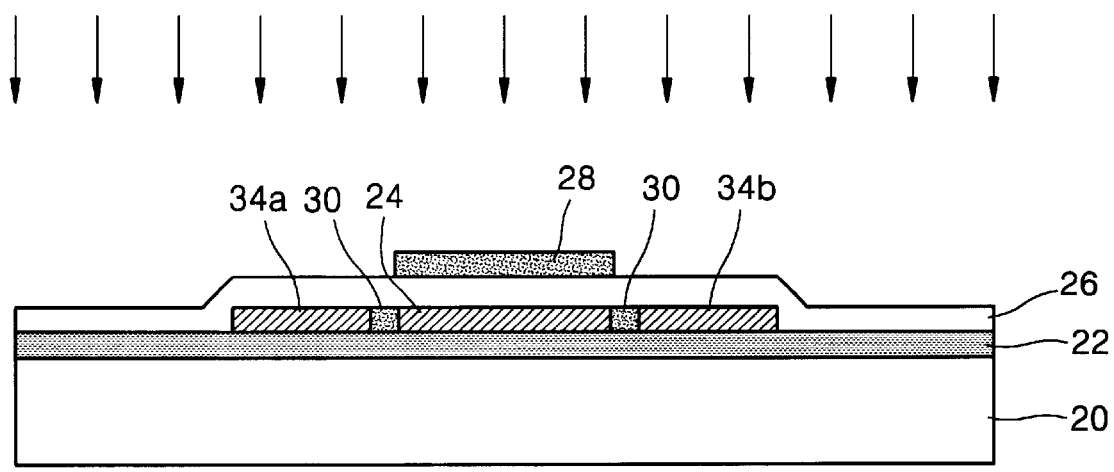

Then, as shown in FIG. 2c, after removing the polymer layer 32, ions are lightly doped to form an LDD region 30 as shown in FIG. 2d. When the ions are not light doped, an offset region will be formed.

While particular embodiments of the present invention have been shown and described, it will be obvious to those skilled in the art that changes and modifications can be made without departing from this invention in its broader aspects and, therefore, the appended claims are to encompass within their scope all such changes and modifications as fall within the true spirit and scope of this invention.

What is claimed is:

1. A method of forming an offset/LDD structure of a thin film transistor, comprising forming an active layer on a substrate;

depositing an insulating layer on the substrate while covering the active layer;

pattern a gate electrode on the insulating layer;

forming a polymer layer such that the polymer layer encloses the gate electrode in a predetermined thickness;

densely doping ions into the active layer using the polymer layer as a mask; and removing the polymer layer, wherein the forming of the polymer layer comprises:

dipping the substrate into electrolyte containing monomer; and generating an electric field by using an electric power supplier having a first end coupled to the gate electrode and a second end coupled to a metal electrode so that polymer is formed enclosing the gate electrode at a predetermined thickness.

2. A method of claim 1 further comprising lightly doping ions into the active layer using the gate electrode as a mask before the forming a polymer.

3. A method of claim 1 further comprising lightly doping ions into the active layer using the gate electrode as a mask after the removing the polymer layer.

4. A method of claim 1 wherein the metal electrode includes a common electrode formed on the substrate.

* * * * *